United States Patent [19]

Matare

[11] 4,000,503

[45] Dec. 28, 1976

[54] COLD CATHODE FOR INFRARED IMAGE TUBE

[75] Inventor: Herbert F. Matare, Los Angeles, Calif.

[73] Assignee: International Audio Visual, Inc., Van Nuys, Calif.

[22] Filed: Jan. 2, 1976

[21] Appl. No.: 646,382

[52] U.S. Cl. .................................. 357/16; 357/30; 357/52

[51] Int. Cl.² ................ H01L 29/161; H01L 27/14

[58] Field of Search ......................... 357/30, 16, 52

[56] References Cited

UNITED STATES PATENTS

| | | | |
|---|---|---|---|
| 3,408,521 | 10/1968 | Dore | 313/94 |
| 3,667,007 | 5/1972 | Kressel | 317/235 R |
| 3,696,262 | 10/1972 | Antypas | 313/94 |
| 3,699,401 | 10/1972 | Tietjin | 317/234 R |
| 3,874,952 | 4/1975 | Woodall | 148/171 |
| 3,900,865 | 8/1975 | Schaefer | 357/30 |
| 3,914,136 | 10/1975 | Kressel | 148/171 |
| 3,932,883 | 1/1976 | Rowland | 357/30 |
| 3,953,880 | 4/1976 | Hara | 357/30 |

*Primary Examiner*—Martin H. Edlow
*Attorney, Agent, or Firm*—John J. Posta, Jr.

[57] ABSTRACT

A cold cathode for an image-type tube such as a vidicon. The cathode features a negative electron affinity surface and a field enhanced electron ejection method. The photons generate electron-hole pairs in a compound semi-conductor structure having Group III and Group V compounds to form a heterojunction.

11 Claims, 11 Drawing Figures

COLD CATHODE FOR INFRARED IMAGE TUBE

BACKGROUND OF THE INVENTION

This invention relates generally to infrared image tubes and particularly relates to a cold cathode for such a tube having a high ratio of emitted free electrons to injected photons.

Modern image sensing devices or image tubes have two basic constructions. One type of image tube is based on the conventional silicon technology. The other construction makes use of the new possibilities based on semi-conductor compounds of Group III – V coupled with the electron emission based on negative electron affinity.

The tubes based on silicon technology feature silicon diode arrays. The diodes in turn must be read out with an electron beam. However, these devices suffer from defects of the diode structure which result in differences in the performance of individual diodes and their differences in resolution.

Recently, charge-coupled devices have been applied to provide better resolution. This has been explained in a paper by Sequin et al entitled "A Charge-Coupled Area Image Sensor and Frame Store" which appears in IEEE Transactions on Electron Devices, Volume ED-20, No. 3, March 1973, pages 244 – 252. This device is a three-phase system, that is, the readout is carried out in three phases and provides better resolution. The device built was provided with 64 × 106 imaging cells.

In order to readout the image the line shifting requires a long integration time. Therefore, for live television the device must be operated in a frame transfer mode, that is, an entire frame is transferred. This device features an active cathode which has the advantage of speed. The readout is effected in a simultaneous process of picture projection by impingement of the secondary electrons on a video screen.

Silicon may also be used in a secondary electron emission mode. However, such a device suffers from high dark current, that is a current in the absence of light and this is due to the properties of the material.

Therefore, for high speed imaging at low light levels, the negative electron affinity concept is very promising. This has been reported by Simon in IEEE Spectrum, December 1972, pages 74 – 78. As stated in the paper, photoemissive sensitivity of negative electron affinity cathodes has dramatically improved since 1958. The values of current in micro-amperes per lumen of instant radiation have increased during this period by a factor of 5 – 6.

Numerous proposals have been made in the past to increase the yield or efficiency of infrared converter tubes. It has been shown that secondary emission from cold cathodes of the Group III – V can be orders of magnitude higher than that for Magnesium oxide. Such cold cathodes may, for example, consist of GaP. It also has been proposed to use heterojunctions of Germanium, Zinc selenide, and P-type Gallium arsenide. For example, one may use Germanium for the infrared emission and Zinc selenide as a junction material. The reason is that there is a close match of the Zn Se lattice to Germanium. In this case, a P-type Gallium arsenide layer is the electron-emitting surface.

Such structures have limited value. They have been used to analyze theoretically the models because neither metallurgical nor technical solutions exist for the required high perfection growths of these heterojunctions with good lattice match.

A paper by Schade entitled "Efficient Electron Emission From GaAs-$Al_{1-x}Ga_xAs$ Optoelectronic Cold-Cathode Structures," which appears in Applied Physics Letters, Volume 18, No. 10, May 15, 1971, pages 413 – 414, deals with semi-conductor cold cathodes and proposed junctions of $Al_{1-x}Ga_xAs$ silicon doped covered with a top layer of GaAs Zinc doped and activated with Cesium and oxygen.

A semi-conductor surface as explained in some of the papers referred to when covered with Cesium or Cesium-oxide will show a negative electron affinity. This is particularly true when care is taken to place the bottom of the conduction band at an energy level higher than that of the vacuum potential. This is so when P-type doping is used. High doping density additionally causes the conduction band depression to increase and the band bending distance to decrease. As a result this distance can be less than the escape depth of the electron into the vacuum.

The surface barrier normally present at the outer surface layer can be reduced by the dipole layer of Cesium or Cesium-oxide.

It is an object of the present invention to produce a cold cathode for an infrared converter or image tube providing high efficiency by appropriately using heterojunctions.

Another object of the present invention is to provide a cold cathode of the type discussed which combines the relatively high quantum efficiency of Gallium arsenide cathodes in the near infrared with the high injection efficiency of P-N heterojunctions.

A further object of the present invention is to provide such a cathode by liquid phase epitaxy.

SUMMARY OF THE INVENTION

In accordance with the present invention there is provided a cold cathode for an infrared converter or image tube which may be of the vidicon type. The cathode uses a semi-conductor combination from Group III and Group V. An example of Group III semi-conductors are Aluminum, Gallium, and Indium, while an example of those of Group V are Arsenic and Phosphorus. By means of such compounds a heterojunction can be provided in such a manner that photons can be injected into the transparent or high band side of the heterojunction. Each photon then releases an electron-hole pair and these are separated at the depletion layer. Due to the applied electric field, electrons are moved across the N-type region to the surface. The surface in turn has negative electron affinity, thus facilitating the emission of the electrons. This, in turn, may be provided by a low work function surface coating such as Cesium, Cesium-oxide, Lithium, or the like. Stoichiometry makes it possible to tailor the cathode to a desired or predetermined optical frequency range, that is to the frequency or wavelength of the injected photons. This frequency range in turn may correspond to the light emitted by active infrared light emitting diodes produced in a similar metallurgical process, which are used as illuminators or infrared light sources. In other words, the response of the cathode can be tailored to the particular function and materials used in infrared light emitting diodes.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings.

DESCRIPTION OF THE PREFERRED EMBODIMENTS

Figure 1:
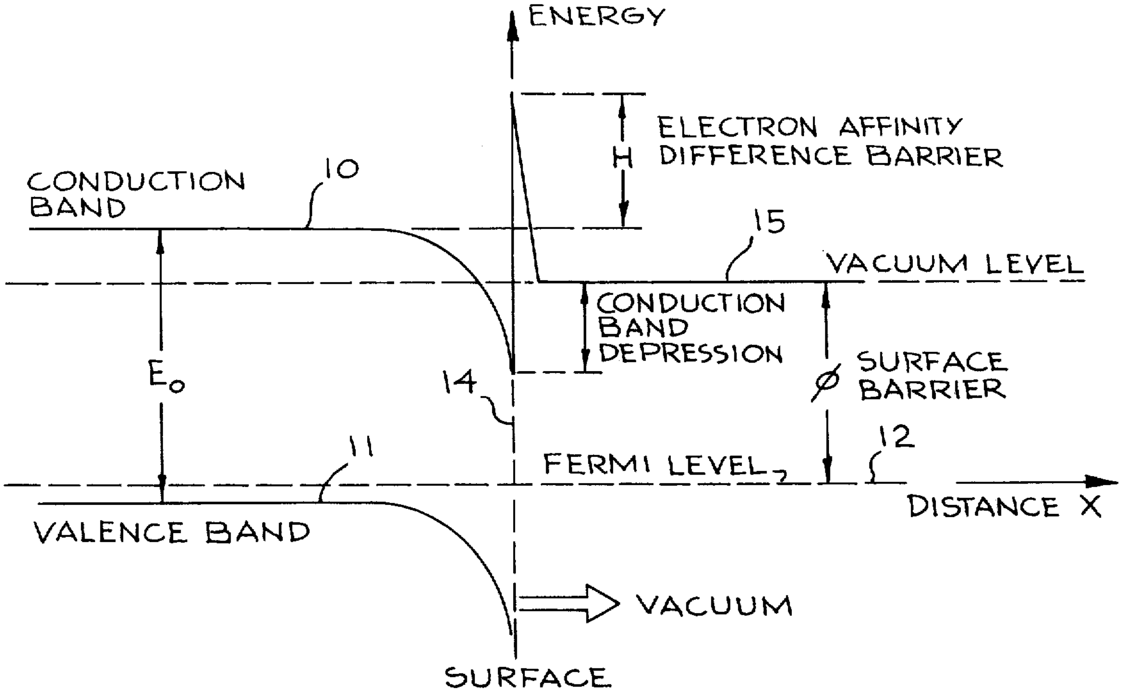
FIG. 1 is the Energy versus X diagram of a negative electron affinity emitter which will be referred to for explanatory purposes.

Referring now to the drawings wherein the same elements are designated by the same reference characters, and particularly to FIG. 1, there is illustrated an Energy versus X band diagram. This diagram relates to a negative electron affinity cathode for purposes of explanation. Thus, in the diagram of FIG. 1, 10 is the conduction band and 11 the valence band of the semiconductive material. The Fermi level is shown at 12 while the vertical line 14 indicates the boundary between the surface of the cathode and the vacuum. The vacuum energy level is indicated at 15. The gap between the Fermi level 12 and the vacuum level 15 is the barrier normally present at the surface which might be termed $\phi$.

Electrons from the conduction band could exit into Vacuo if the energy $\phi$ could be provided were it not for the existence of the electron affinity barrier H. This barrier can be effectively reduced by an outer Cesium layer which provides a dipole potential. The result is that electrons from the conduction band 10, which are liberated by the infrared photon energy as shown and which are created in the semi-conductor, can escape into the vacuum. Thus, basically, the barrier energy is materially reduced so that injected I. R. photons can create electrons in the semi-conductor material which in turn can escape into vacuum. This, of course, explains the term negative electron affinity.

With this general introduction the structure of FIG. 2 will now be explained and more readily understood. Thus, generally, to achieve a maximum of efficiency, that is a high ratio of electrons per incident photon, the principle of the negative affinity cathode as shown by the diagram of FIG. 1 is combined with the principle of electron injection from heterojunctions.

It is possible to provide heterojunctions which are transparent to the photons, that is to the infrared light. The heterojunction may consist of $$Ga_xAl_{1-x}As \quad (1)$$

on Gallium arsenide as a base which emits electrons from a negative affinity surface. This surface may, for example, consist of P-type semi-conductor which has been Cesium-activated. In this case, the dopant of the Gallium arsenide may consist of Silicon with a concentration of $10^{17}$ atoms per $cm^3$. Furthermore, the $x$ in the above formula may vary between 0.4 and 0.7.

Figure 2:
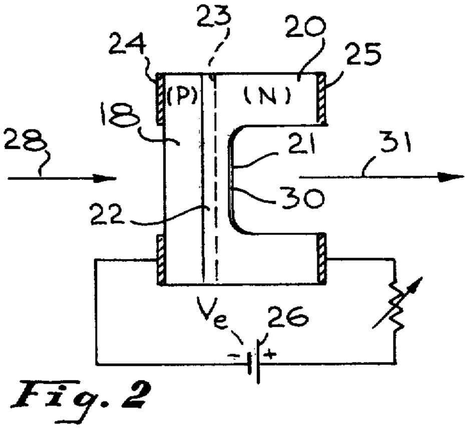
FIG. 2 is a schematic view of a cold cathode structure featuring a heterojunction in accordance with the present invention.
Figure 4:
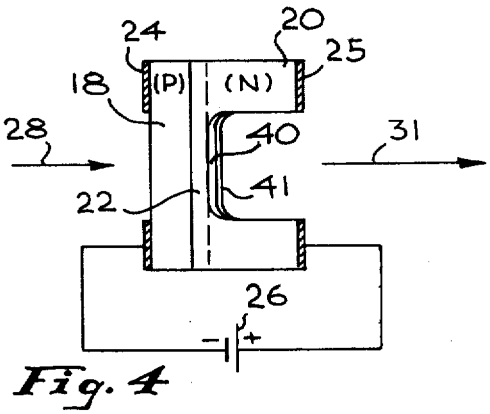
FIG. 4 is a schematic view of another cold cathode in accordance with the present invention featuring a P-N-P structure.

The devices as illustrated in FIGS. 2 and 4 are of the type having a transparent window forming part of the device so that the light enters the device on one side while the electrons leave on the opposite side.

The structure of FIG. 2 includes a P-type semi-conductor region 18 which may consist of GaAlAs. This is provided on a body 20 of Gallium Arsenide. It may, for example, be provided by liquid phase epitaxy. This technique has been disclosed in the Applicant's co-pending patent application, Ser. No. 657,173, filed 2/11/76, entitled Method and Apparatus for forming an epitaxial layer on a crystalline substrate relating to heteroepitaxy. The Gallium Arsenide region 20 is of the N-type and provide a substrate on the order of 10 mils thick. The center portion 21 is thinned down as indicated so as to decrease absorption of the electrons which are liberated in the depletion layer 22 bounded by the dotted line 23 and adjacent the P-N junction.

A pair of electrodes 24 and 25 is provided which may be of annular shape. The electrode 24 is disposed on the P-type portion 18, while electrode 25 is arranged on the N-type portion 20, both electrodes making ohmic contact with the semi-conductive material. Battery 26 is connected between the electrodes 24 and 25 and generates a voltage $V_e$. This in turn provides an electric field in the device of FIG. 2.

As indicated above, the Gallium Aluminum Arsenide may have a stoichiometry of $$Ga_{0.7}Al_{0.3}As \quad (2)$$

In this case, the $x$ of the previous formula (1) is 0.7. This material is transparent from the visible red region down to the near infrared.

The light which impinges as shown by the arrow 28 on the P-type layer 18 generates electron-hole pairs or carriers at junction 23. The electrons are drawn into the depletion layer 22 and then are field transported into the higher resistivity N-type crystal consisting of Gallium Arsenide. The field provided by the battery 26 is sufficient to enhance the transport of the electrons across the depletion layer 22 into the N-type material 20. A Cesium-oxide layer 30 may be provided on the surface of the N-type layer 20. This may, for example, be effected by evaporating Cesium and oxide onto the surface. Alternate low-work function coatings may be provided such as Lithium.

It is also possible to support the P-type layer 18 of the wafer by some material transparent to the infrared injected light. The N-type layer 20 may be thinned down until the cesiated surface layer 30 can be reached by the extended front of the space charge which decreases the electron absorption. The electrons are emitted in a direction shown by the arrow 31.

Figure 3:
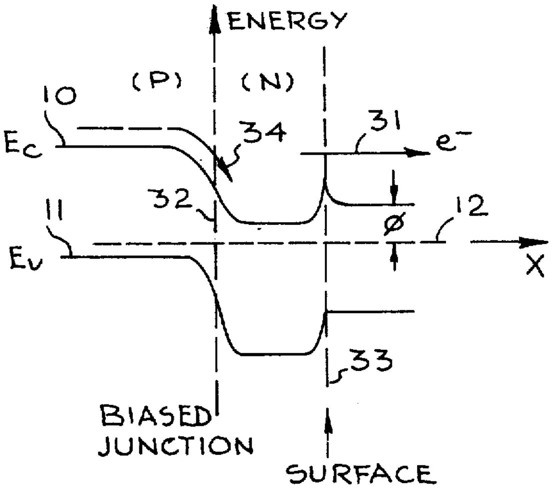
FIG. 3 is an Energy versus X diagram corresponding to the structure of FIG. 2.

FIG. 3 illustrates the energy band scheme of the device of FIG. 2. Again, the conduction band is shown at 10, the valence band at 11, the Fermi level at 12. The P-N junction is shown by the dotted vertical line 32, and the region between the surface and the vacuum is shown by the line 33. FIG. 3 illustrates the field emission of the electrons through the depletion layer 22 in the N-type layer. The electrons follow the energy path indicated by the curved arrow 34. The electrons as shown by the arrow 31 are capable of tunneling through the peak of the conduction band 10 at the boundary 33.

The device if FIG. 4 enhances the action of the electron emitter represented by the cesiated surface. To this end a thin P-type layer 40 is created on the inner or curved surface of the etched out N-type layer 20. This, in turn, is again covered by a Cesium-oxide layer 41. Hence, it will be seen that the device of FIG. 4 consists of a P-N-P type structure with an electron emitting surface.

The thin P-type layer 40 may, for example, be obtained by argon sputtering and heating of the wafer in a vacuum. This will create a thin surface layer 40 with P-type behavior after the N-type impurities out-diffuse from the surface layer. Again, a Cesium-oxide layer 41 is deposited under high vacuum.

The P-type layer 40 may also be obtained by sputtering and annealing at about 600° C for a short period. This will again yield a thin P-type surface layer.

Figure 5:
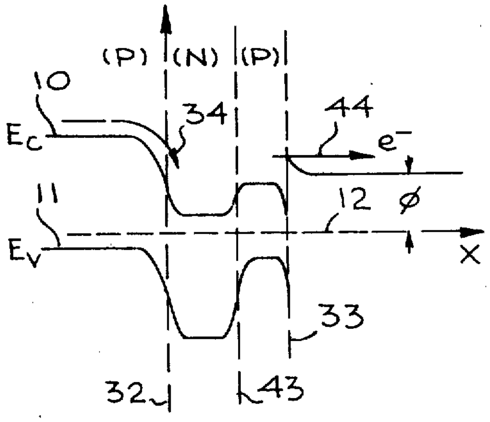
FIG. 5 is an Energy versus X diagram corresponding to the structure of FIG. 4.

FIG. 5 illustrates again the band diagram. Again, the P-N junction is shown by the vertical line 32 while the line 33 shows the boundary between the surface and the vacuum; line 43 illustrates the additional N-P junction. The arrow 44 indicates the energy path of an electron which tunnels through the peak of the conduction band 10 at the surface vacuum interface. In other words, the electrons have sufficient energy to tunnel through the thin Cesium-oxide surface layer. It should be noted that the second N-P layer is forward biased due to the applied electric field. In other words, the depletion layer 22 is widened so that it can reach the P-type negative electron affinity layer 41 with the Cesium coating. Hence, the electrons are transported by the electric field directly into the electron emitting P-type region.

For certain devices it may not be necessary to provide a cathode having a window which is transparent to the photons such as infrared light. In other words, it may not be necessary to have the light impinge in direct line with the emitted electrons. In this case, the cathode must be operated in the reflection mode. Therefore, the photons impinge onto the same surface from which the electrons emerge in the opposite direction.

Figure 6:
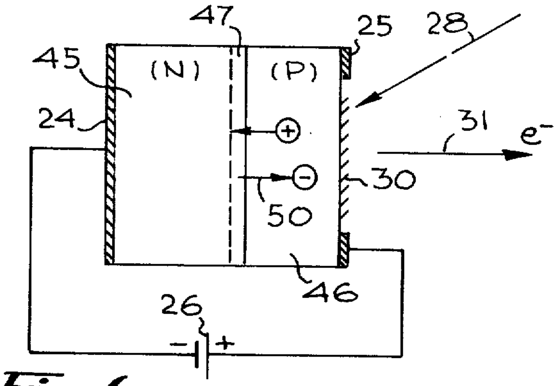
FIG. 6 is another cold cathode which does not have a light transparent layer and therefore has to be operated in the reflection mode.

Such a device is illustrated in FIG. 6 to which reference is now made. Specifically, FIG. 6 illustrates an epitaxial P-N junction which may be made by the liquid phase epitaxy briefly referred to. The structure provides an N-type layer 45 which may consist of Gallium Arsenide and a P-type layer 46 which may consist of GaAlAs. The depletion layer is shown at 47.

It will be noted that the light or photons 28 impinge on the right-hand side or P-type layer 46 from which the electrons 31 emerge. Since the N-type layer 45 is not transparent to the photons, the electrode 24 may cover the entire surface of the structure.

The photons indicated at 28 liberate electron-hole pairs at the junction where they are separated. The electrons are drawn into the P-type region 46, as shown by arrow 50; while the holes move in the opposite direction. The electrons are now set free again through the negative electron affinity surface layer 30.

Figure 7:
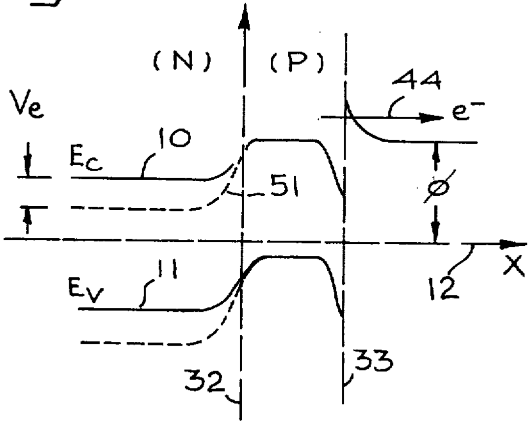
FIG. 7 is an Energy versus X diagram of the structure of FIG. 6.

The corresponding band scheme is illustrated in FIG. 7 which should be obvious in view of the previous explanations. The dotted line 51 may illustrate schematically the movement of valence and conduction band due to the bias voltage $V_e$. Again, the electrons as shown by the arrow 44 are capable of tunneling through the peak of the conduction band, that is through the affinity surface layer. The bias provided by the voltage source 26 at the junction at 32 is below the threshold for light emission.

Figure 8:
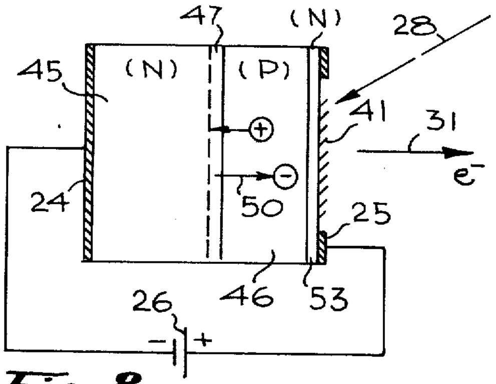
FIG. 8 is still another structure in accordance with the present invention featuring an N-P-N junction and which also has to be operated in the reflection mode.

A still more efficient structure has been illustrated in FIG. 8, which is similar to that of FIG. 6. However, in this case, a thin N-type layer 53 has been provided adjacent the P-type layer 46 and below the cesiated surface layer 41. Hence, the structure of FIG. 8 is an N-P-N structure somewhat analogous to the P-N-P structure of FIG. 4. The thin N-type layer 53 on top of the P-type layer 46 may be provided in various ways, for example, by sputtering, argon bombardment, and out-diffusion or deposition of an N-type semi-conductor layer (e.g. Germanium). With the bias provided by the battery 26 across the entire structure the first N-P junction between regions 45, 46 work in the forward range. However, the second P-N junction between layers 46 and 53 is reverse biased. This will be evident from the corresponding band diagram in FIG. 9.

The forward bias of the first N-P junction between layers 45 and 46, is again kept below or near the threshold of light emission. Strong injection would induce a dense population of electrons and holes. Radiative recombination of the electron-hole pairs would saturate the surface layer with carriers which is undesirable. Hence, operation below the threshold level sensitizes the transparent GaAlAs layer 46 to the incoming photons. It also enhances the field emission across the second N-type layer 53 and the Cesium-oxide layer 30 into the vacuum.

Figure 9:
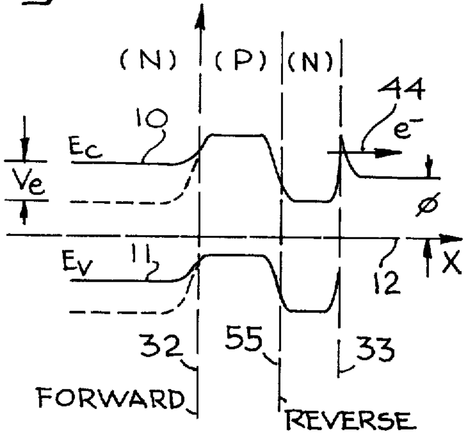
FIG. 9 is an Energy versus X diagram of the structure of FIG. 8.

In other words, the N-P-N structure is biased and hence will inject electrons from the first N-P junction between layers 45 and 46, which forward biased. These electrons are accelerated across the second N-type layer 53 before they tunnel again through the Cesium-oxide barrier which has a low surface energy as shown by the conduction band curve 10 of FIG. 9. In the diagram of FIG. 9, the vertical line 55 indicates the location of the second P-N junction, while the vertical line 33 again indicates location of the interface between the surface and the vacuum.

Figure 10:
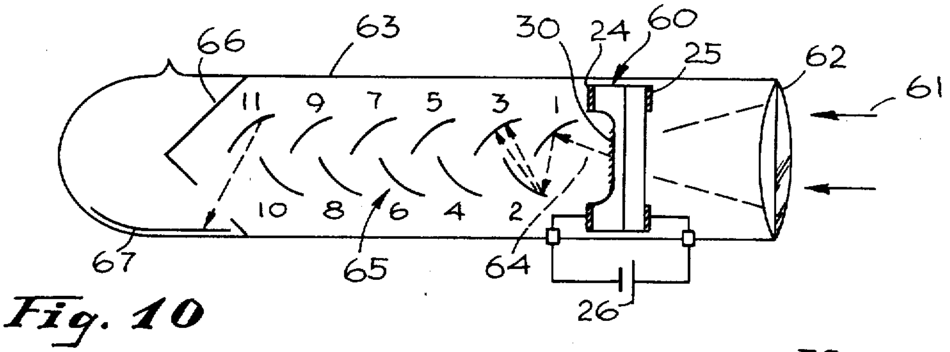
FIG. 10 illustrates a cathode in accordance with the present invention of the type illustrated in FIGS. 2 and 4, in combination with an electron multiplier and fluorescent screen.

A practical infrared converter or image tube in accordance with the present invention making use of the structure of FIGS. 2 or 4, has been illustrated in FIG. 10. The cathode indicated at 60 may either be that of FIG. 2 or of FIG. 4. In other words, the cathode 60 is transparent to the incoming light shown at 61 passing through optics 62 of the evacuated container 63. The cathode is again biased by the battery 26 in the manner previously described. The electrons indicated at 64 emerge from the Cesium-oxide layer 30 and impinge on an electron multiplier 65 which, as shown, may have a plurality of stages such as the 11 stages shown. The last stage is screened by a baffle 66 and the secondary electrons provided by the electron multiplier 65 impinge on a screen 67 within the evacuated container 63. The screen 67 may be a fluorescent screen such as Cadmium Sulphide or Zinc Sulphide screen.

Depending on the form of the dynodes of the electron multiplier 65, the screen 65 may be flat, or curved as shown. It will, of course, be understood that suitable accelerating voltages are applied between the successive dynodes of electron multiplier 65. Instead of a window 62, a suitable lens may be provided.

Figure 11:
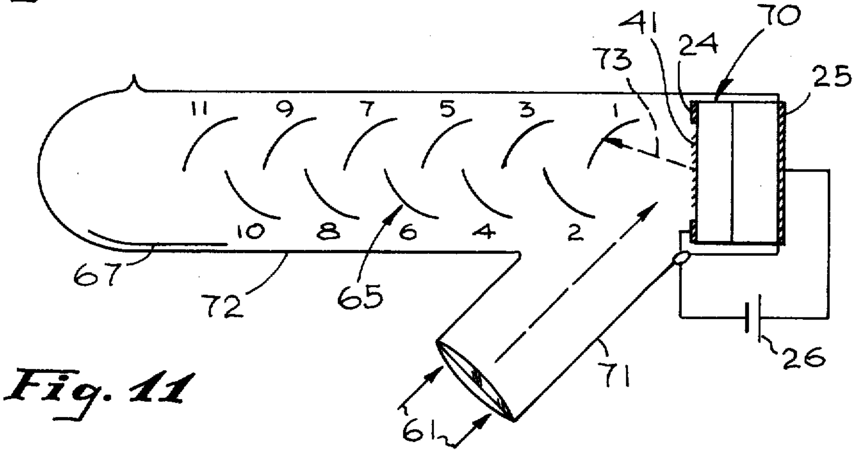
FIG. 11 is another image structure utilizing a cathode of the type shown in FIGS. 6 and 8, and which must be operated in the reflection mode coupled to an electron multiplier and fluorescent screen.

Another image converter or image tube in accordance with the invention is illustrated in FIG. 11. The cathode structure 70 of FIG. 11 may either be that of FIG. 6 or that of FIG. 8. Accordingly, the device must be operated in reflection. The light, as shown by the arrows 61, enters a side branch 71 of the evacuated container 72 to impinge on the cesiated surface 41. The structure is again biased by the battery 26 through the electrodes 24 and 25.

The electrons emerge as indicated by the arrow 73 and are again fed into an electron multiplier 65 with a plurality of dynode stages. The accelerated and multiplied electrons then impinge on the screen 67 which may be similar to that of FIG. 10. It is also feasible to use a Schmidt optic system. In this case, the cathode may be disposed in the center of a concave reflector or mirror from which the electrons start into the electron multiplier 65.

There has thus been disclosed a cold cathode suitable for infrared image converters or image tubes of the vidicon type. The cathode combines a negative electron affinity surface layer with electron injection from heterojunctions. Accordingly, the electrons of electron-hole pairs created by impinging photons are capable of traversing the negative electron affinity surface layer to move directly into a vacuum. Electrons in turn are moved by the electric field provided across the junctions.

What is claimed is:

1. A cold cathode for an infrared image converter device, said cathode comprising:

a. a body of semi-conductive material;

b. said body consisting of a semi-conductor combination selected from Group III and Group V elements to provide a heterojunction having at least one P-type and one N-type region;

c. means for biasing said body in the reverse direction; and d. a surface coating on said N-type region having a low work function, whereby infrared light impinging on the transparent region of the heterojunction will create electron-hole pairs, the electrons being carried across the depletion layer of said N-type region by the electric field and across the N-type region toward said surface coating.

2. A cold cathode as defined in claim 1 wherein said N-type region is of reduced thickness at its center so that said bias means causes the depletion layer to extend into the neighborhood of said surface coating.

3. A cold cathode as defined in claim 1 wherein said surface coating consists of Cesium-oxide.

4. A cold cathode as defined in claim 1 wherein said heterojunction consists of Gallium-Aluminum-Arsenide for said P-type region on Gallium Arsenide forming said N-type region.

5. A cold cathode as defined in claim 4 wherein said P-type region consists of $Ga_xAl_{1-x}As$, where $x$ of a number smaller than 1, said Gallium Arsenide being doped with Silicon.

6. A cold cathode as defined in claim 5 wherein $x$ is between 0.4 and 0.7.

7. A cold cathode as defined in claim 1 wherein said P-type region consists of GaAsP and said N-type region consists of GaAs.

8. A cold cathode as defined in claim 1 wherein said P-type region consists of InGaAs and said N-type region consists of GaAs.

9. A cold cathode as defined in claim 1 wherein an addition P-type layer is provided on said N-type layer and below said surface coating, whereby the P-N junction between said P-type region and said N-type region is biased in the reverse direction while the basic N-P junction is biased in the forward direction.

10. A cold cathode for an infrared converter tube comprising:

a. a semi-conductive body;

b. said body having an N-type region consisting of Gallium-Arsenide and a P-type region consisting of Gallium-Aluminum-Arsenide;

c. a negative electron affinity surface layer disposed on top of said P-type region; and d. means for biasing said body so that the N-P junction is biased in the reverse direction, said N-type region being not transparent to infrared photons, whereby photons impinging upon said P-type region release hole-electron pairs, the electrons being accelerated by the electric field to said surface layer and ejected into vacuum.

11. A cold cathode as defined in claim 10 wherein an additional N-type layer is provided on said P-type region and below said surface layer, thereby to form an N-P-N structure.

* * * * *